United States Patent
Svortdal (10) Patent No.: US 10,720,857 B2
(45) Date of Patent: Jul. 21, 2020

(54) ELECTRONIC CIRCUIT FOR CONTROLLING CHARGING OF A PIEZOELECTRIC LOAD

(71) Applicant: Polight ASA, Horten (NO)

(72) Inventor: Tore Svortdal, Horten (NO)

(73) Assignee: Polight ASA, Horten (NO)

(*) Notice: Subject to any disclaimer, the term of this patent is extended or adjusted under 35 U.S.C. 154(b) by 0 days.

(21) Appl. No.: 16/061,966

(22) PCT Filed: Jan. 6, 2017

(86) PCT No.: PCT/EP2017/050267
§ 371 (c)(1),
(2) Date: Jun. 13, 2018

(87) PCT Pub. No.: WO2017/118732
PCT Pub. Date: Jul. 13, 2017

(65) Prior Publication Data
US 2018/0367065 A1 Dec. 20, 2018

(30) Foreign Application Priority Data
Jan. 6, 2016 (EP) ..................... 16150334

(51) Int. Cl.
*G02B 7/02* (2006.01)
*H02N 2/06* (2006.01)
(Continued)

(52) U.S. Cl.
CPC .......... *H02N 2/065* (2013.01); *G02B 26/0875* (2013.01); *H01L 41/042* (2013.01); *H02N 2/026* (2013.01); *H02M 3/07* (2013.01)

(58) Field of Classification Search
CPC .................. H01L 41/042; H02N 2/06
(Continued)

(56) References Cited

U.S. PATENT DOCUMENTS 6,362,632 B1   3/2002 Livingston
7,312,274 B2   12/2007 Millard et al.
(Continued)

FOREIGN PATENT DOCUMENTS

EP          1139448 B1    10/2001
WO    WO 2007/088390 A1   8/2007
WO    WO 2008/100154 A1   8/2008

OTHER PUBLICATIONS

International Search Report for PCT/EP2017/050267 dated Feb. 22, 2017.

*Primary Examiner* — Mahidere S Sahle
(74) *Attorney, Agent, or Firm* — Knobbe Martens Olson & Bear LLP (57) ABSTRACT

The invention relates to an electronic circuit (100) for controlling charging of a piezoelectric load (190). The electronic circuit comprises a charge pump (111) configured to supply a charging current to the piezoelectric load dependent on a charge control signal (131), a measurement circuit (113) configured to obtain a load voltage corresponding to a terminal voltage at a load terminal of the piezoelectric load, a comparator circuit (114) configured to compare an adjustable reference voltage with the load voltage. The electronic circuit is configured to determine the charge control signal dependent on the comparison so that the control signal controls delivery of the charging current dependent on the comparison. The electronic circuit is further configured to set the adjustable reference voltage to a target voltage (VT) and to set the adjustable reference voltage to a low limit voltage (Vlow), being lower than the target voltage, when the load voltage reaches the target voltage.

16 Claims, 7 Drawing Sheets

(51) Int. Cl.
*H01L 41/04* (2006.01)
*G02B 26/08* (2006.01)
*H02N 2/02* (2006.01)
*H02M 3/07* (2006.01)

(58) Field of Classification Search
USPC .................. 310/316.01, 317; 359/822–824
See application file for complete search history.

(56) References Cited

U.S. PATENT DOCUMENTS

| | | |
|---|---|---|
| 7,312,554 B2 | 12/2007 | Vogeley |
| 2007/0018534 A1 | 1/2007 | Sciortino et al. |
| 2007/0109064 A1 | 5/2007 | Micko |
| 2012/0212099 A1 | 8/2012 | Tajima et al. |

ELECTRONIC CIRCUIT FOR CONTROLLING CHARGING OF A PIEZOELECTRIC LOAD

CROSS REFERENCE TO RELATED APPLICATIONS

This application is a U.S. National Phase Application of PCT International Application Number PCT/EP2017/050267, filed on Jan. 6, 2017, designating the United States of America and published in the English language, which is an International Application of and claims the benefit of priority to European Patent Application No. 16150334.7, filed on Jan. 6, 2016. The disclosures of the above-referenced applications are hereby expressly incorporated by reference in their entireties.

FIELD OF THE INVENTION

The invention relates to electronic circuits for controlling charging of capacitive loads, particularly piezoelectric loads and piezoelectric loads arranged as actuators for a deformable lenses.

BACKGROUND OF THE INVENTION

Piezoelectric loads, e.g. piezoelectric elements, are normally powered by a charge pump or current amplifier. There are several challenges involved in connection with controlling charging of piezoelectric loads, and capacitive loads in general. One challenge relates to controlling the piezoelectric load in order to control the elongation or contraction of the piezoelectric load.

Control of the elongation or contraction of a piezoelectric load is important for applications where the piezoelectric load is used for actuating deformable lenses, e.g. lenses which are used for imaging purposes. In order to obtain a high image quality, e.g. sharpness of the image, the lens must be deformed predictably to obtain a desired optical power.

Accordingly, there is a need to improve control of piezoelectric loads, e.g. piezoelectric loads for actuating deformable lenses.

There is also a need for obtaining information about the state, e.g. health state or change of piezoelectric characteristics, of the piezoelectric load due to aging.

SUMMARY

In general it is an object to improve control of piezoelectric loads.

It is a further object of the present invention improve control of piezoelectric loads used for actuating deformable lenses.

It is also an object of the present invention to provide methods for characterising the state of the piezoelectric element and to obtain other advantages such as power savings, and to predict short-term piezoelectric characteristics, such as a sensitivity of the piezoelectric actuator as a function of an applied voltage.

In a first aspect of the invention there is provided an electronic circuit for controlling charging of a piezoelectric load. The electronic circuit comprises a charge pump configured to supply a charging current to the piezoelectric load dependent on a charge control signal. The circuit further comprises a measurement circuit configured to obtain a load voltage corresponding to a terminal voltage at a load terminal of the piezoelectric load, and a comparator circuit configured to compare an adjustable reference voltage with the load voltage. The electronic circuit is configured to determine the charge control signal dependent on the comparison so that the control signal controls delivery of the charging current dependent on the comparison. The electronic circuit is further configured to set the adjustable reference voltage to a target voltage and to set the adjustable reference voltage to a low limit voltage, being lower than the target voltage, when the load voltage reaches the target voltage.

The magnitude of the charging current is dependent on the size of the pump capacitors and other physical parameters which remain constant during the lifetime of the circuit. Therefore the output voltage/output current capacity will be repeatable for any given circuit over its lifetime. The control circuit may also be able to control the magnitude of the charging current from the pump by for example adjusting a clock frequency (1/ts) of a signal controlling the charge transfer within the charge pump.

The purpose of the electronic circuit is to allow the load voltage to fluctuate in a programmable voltage range between the target voltage and the low limit voltage. During this period the charge pump is switched off so that noise emitted by the charge pump and electronic circuit is minimised. At the same time, the current consumed by the electronic circuit may be further reduced by temporarily switching off other parts of the circuit, such as the measurement circuit, so that lifetime of the battery which powers the circuit may be extended.

According to an embodiment, the electronic circuit is configured to generate the charge control signal dependent on the comparison so that the control signal controls the charge pump to supply the charging current if the reference voltage is larger than the load voltage.

According to an embodiment, the electronic circuit electronic circuit is further configured to generate the charge control signal dependent on the comparison so that the control signal controls the charge pump to stop supplying the charging current if the reference voltage is smaller than the load voltage or after the load voltage has reached the target voltage.

According to an embodiment, the electronic circuit is configured to set the adjustable reference voltage to the target voltage, when the load voltage reaches the low limit voltage.

Accordingly, the electronic circuit may be configured to alternately 1) generate the charge control signal so that the control signal controls the charge pump to stop supplying the charging current (or to maintain at state where charging current is not supplied) if the reference voltage, e.g. low limit voltage, is smaller than the load voltage or if the load voltage has reached the reference voltage and 2) set the adjustable reference voltage to the target voltage, when the load voltage reaches the low limit voltage so that control signal controls the charge pump to supply the charging current again as long as the reference voltage, e.g. the target voltage, is larger than the load voltage.

Accordingly, the load voltage of the piezoelectric load is automatically adjusted so that the piezoelectric load is controlled to keep a desired elongation within limits. Accordingly, a deformable lens actuated by the piezoelectric load may be controlled so that the optical power remains within predetermined max and min values.

According to an embodiment, the electronic circuit is configured to obtain the load voltage at discrete points in time or sampling instants. Advantageously, by obtaining the load voltage at discrete points in time, discharging of the piezoelectric load is reduced. The circuit may be put in a low-power mode (by switching off parts of the circuits or reducing system clock frequency) between these sampling instants to further reduce power consumption and noise emission.

According to an embodiment, the electronic circuit further comprises a counter circuit configured to determine a charging or discharging time between a first point in time when the load voltage has a first voltage and a second point in time when the load voltage has a second voltage.

According to a related embodiment, the first point in time is a point in time wherein the charge pump initiates charging wherein the first voltage is an initial load voltage.

Since the charging current is known and since the charging time can be determined by the counter circuit, the capacitance of the piezoelectric load during charging can be determined, e.g. for the purpose of characterising the state of the piezoelectric load.

According to an embodiment, the electronic circuit further comprises a current sink for discharging the piezoelectric load with a controllable sink current.

For example, the current sink may be a voltage reduction circuit, e.g. comprised by the measurement circuit, where the voltage reduction circuit is connected to the load for reducing the terminal voltage to the load voltage.

In another embodiment, the electronic circuit is configured for isolating the measurement circuit from the load in between sampling instants (ts). In this way, the current draw from the load in the hold state may be minimized, by only connecting the measurement circuit, and the associated current draw, momentarily at each sampling instant.

It may be an advantage to use the voltage measurement circuit for discharging the piezoelectric load during discharging phases, so that other sink circuits are not required. When the discharging current drawn by the voltage measurement circuit and a measurement duty cycle are known, and the discharging time between two voltages has been determined, the capacitance of the piezoelectric load can be determined or approximated. The resolution of this measurement is determined by the sampling frequency (1/ts), the rate of change of load voltage, and the approximated charging or discharging current.

According to an embodiment, the first point in time is the time when load voltage has reached the target voltage, and the second point in time is the time when the load voltage has reached the low limit voltage, and the piezoelectric load has been discharged substantially by a leakage current comprising a leakage current of the piezoelectric load and a measurement current drawn at least by the measurement circuit.

In an embodiment, the charging current is an adjustable charging current, depending on the charge control signal from the electronic circuit. In this way, the rate of change of the load voltage during charging may be manipulated by adjusting the charging current. An advantage of this is either to increase the resolution of a capacitance measurement, or to adjust the rate of change according to application requirements. Such requirements could be a desired rate of change of the load voltage or to accommodate for different capacitive loads in a multi-load system.

Analogously, the sink current may be made adjustable for essentially the same reasons.

A second aspect of the invention relates to a piezoelectric actuator system comprising, an electronic circuit according to the first aspect, and the piezoelectric load.

A third aspect of the invention relates to a deformable lens unit. The lens unit comprises the piezoelectric actuator system according to the second aspect, and a deformable lens arranged to be deformed by the piezoelectric load. The piezoelectric actuator system is configured to deform the lens to achieve different optical powers.

In an embodiment related to the deformable lens unit, the electronic circuit is configured to set the target voltage and/or low limit voltage dependent on a control parameter.

Accordingly, the reference voltage used for setting the target voltage or low limit voltage may be set dependent on other parameters, e.g. parameters relating to settings of a camera containing the lens unit.

A fourth aspect of the invention relates to a method for controlling charging of a piezoelectric load. The method comprises supplying a charging current to the piezoelectric load dependent on a charge control signal. The method further comprises obtaining a load voltage corresponding to a terminal voltage at a load terminal of the piezoelectric load, and comparing an adjustable reference voltage with the load voltage. Finally, the method comprises determining the charge control signal dependent on the comparison so that the control signal controls delivery of the charging current dependent on the comparison, and setting the adjustable reference voltage to a target voltage and setting the adjustable reference voltage to a low limit voltage being lower than the target voltage, after the load voltage has reached the target voltage.

According to an embodiment of the method, adapted for controlling charging of multiple loads, the method further comprises supplying a second charging current to a second piezoelectric load dependent on a second charge control signal (135), and obtaining a second load voltage corresponding to a terminal voltage at a second load terminal of the second piezoelectric load. Then comparing a second adjustable reference voltage with the second load voltage, and determining the second charge control signal dependent on the comparison so that the second control signal controls delivery of the second charging current dependent on the comparison. Finally, setting the second adjustable reference voltage to a second target voltage (VT) and setting the adjustable reference voltage to a second low limit voltage (Vlow) being lower than the second target voltage, when the second load voltage reaches the second target voltage.

BRIEF DESCRIPTION OF THE DRAWINGS

Embodiments of the invention will be described, by way of example only, with reference to the drawings, in which.

DESCRIPTION OF AN EMBODIMENT

Figure 1:
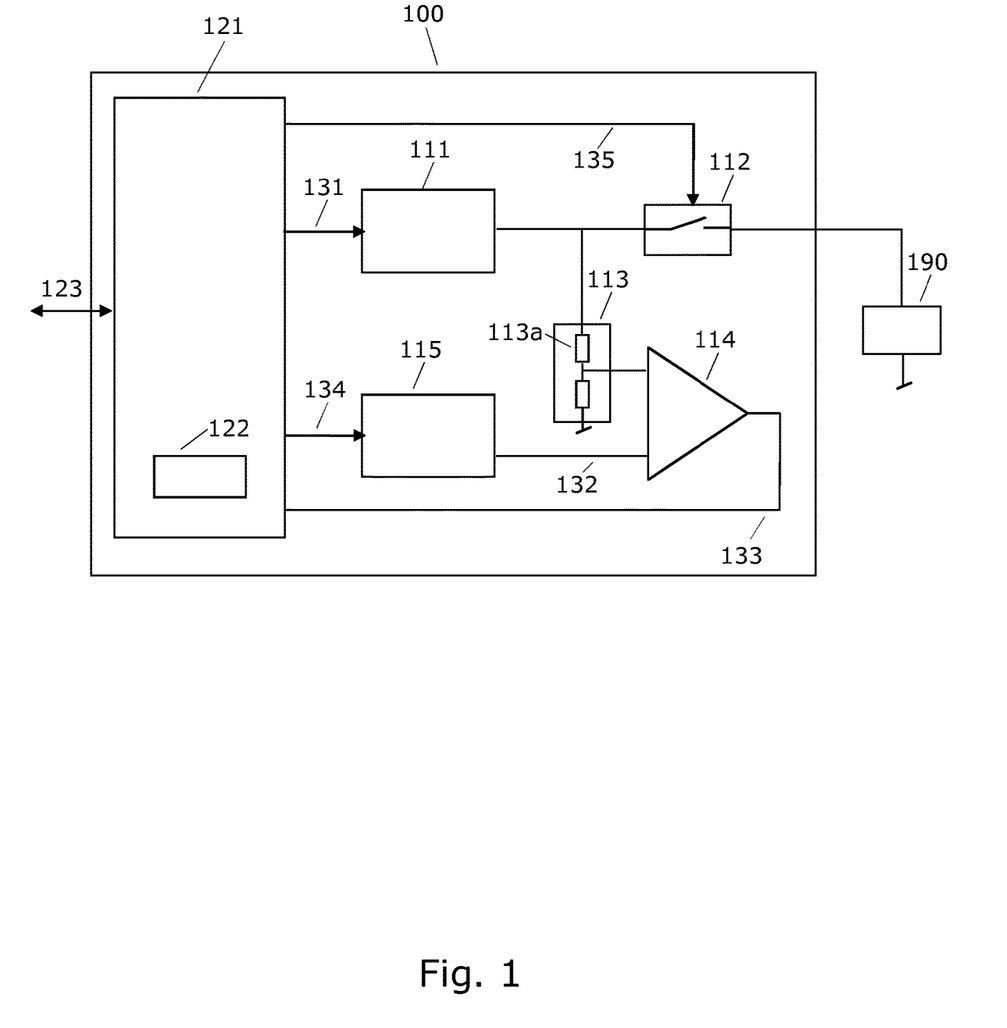
FIG. 1 illustrates a first embodiment of electronic circuit for controlling charging of a piezoelectric load.

FIG. 1 shows an electronic circuit 100 for controlling charging of a piezoelectric load 190, e.g. a piezoelectric based actuator. The electronic circuit is also referred to as a piezo driver 100.

The electronic circuit comprises a charge pump 111 configured to supply a charging current to the piezoelectric load 190 dependent on a charge control signal 131. The charge pump is an electronic circuit, e.g. a voltage to current amplifier capable of generating a controllable current dependent on an input voltage. Thus, the charge pump may be capable of generating a constant current for charging the piezoelectric load or other capacitive loads. The magnitude of the charging current can be further controlled by for example adjusting the clock frequency of the charge pump. This allows manipulating the resolution of the capacitance measurement, since the charging slope can be changed while a frequency of the counter circuit is kept unchanged.

The electronic circuit further comprises a voltage measurement circuit 113 configured to determine a load voltage corresponding to a terminal voltage at a load terminal of the piezoelectric load. The terminal voltage is the voltage, e.g. relative to the ground voltage, at an electrical connection arranged to receive the charging current.

The measurement circuit 113 may be configured as a resistive circuit 113*a*, e.g. a resistive voltage divider, which provides a down-scaled voltage corresponding to the terminal voltage, i.e. the load voltage.

The measurement circuit 113 may also be embodied by or include an analogue-to-digital converter, i.e. an AD converter capable of converting the terminal voltage or a down-scaled terminal voltage to a digital value. The measurement circuit 113 could also be configured as a capacitive voltage measurement circuit.

The electronic circuit further comprises a comparator circuit 114 configured to compare an adjustable reference voltage 132 with the load voltage, and sends a binary signal (133) to the control unit indicating which of the comparator inputs has the highest voltage.

The electronic circuit 100, e.g. the control logic 121, is configured to determine the charge control signal 131 dependent on the comparison so that the charge control signal 131 controls delivery of the charging current dependent on the comparison, i.e. dependent on the output 133 from the comparator circuit 114. The charge pump may be controlled to start, stop or continue delivery of the charging current dependent on the comparison between the adjustable reference voltage 132 and the load voltage. The magnitude of the charging current of the pump can be adjusted by host-controlled parameters in the control unit, such as an input or clock frequency of the signal controlling the charge transfer within the charge pump.

The electronic circuit 100 is configured to set the adjustable reference voltage to a target voltage and to set the adjustable reference voltage to a low limit voltage after the load voltage has reached the target voltage, where the low limit voltage is a lower than the target voltage. As an example, the electronic circuit 100 may be configured with a voltage reference controller 115 capable of generating and adjusting the adjustable reference voltage 132, e.g. based on a reference signal 134 from the control logic 121. In some embodiments, the voltage reference controller 115 may be implemented as a digital-analogue-converter (DAC), while in other embodiments, the voltage reference controller may be implemented as a pulse-width-modulation modulator followed by an integrator. The adjustable reference voltage 132 could also be determined by the control logic 121 without use of the reference controller 115.

Accordingly, the electronic circuit 100 is capable of controlling charging of the piezoelectric load by determining the charge control signal 131 so that the load 190 is charged or not charged by the charge pump dependent on the comparison between the reference voltage and the load voltage.

The electronic circuit may further comprise a load switch 112 connected to the piezoelectric load 190, the output of the charge pump 111 and the measurement circuit 113. Accordingly, the load switch is controllable, e.g. via switch signal 135, to connect and disconnect the load 190 from the output of the charge pump 111 and the voltage measurement circuit 113.

The adjustable reference voltage 132, the reference signal 134, the switch signal 135 and/or the charge control signal 131 may be determined by the control logic 132, e.g. dependent on driving parameters supplied to the control logic 132 via a control interface 123.

The electronic circuit 100 may configured to generate the charge control signal 131 so that control signal controls the charge pump to supply the charging current if the reference voltage 132 is larger than the load voltage. Accordingly, as long the load voltage has not reached the reference voltage, e.g. a desired target voltage for the piezoelectric load, the charging of the load 190 is continued.

The electronic circuit 100 may be configured to generate the charge control signal dependent on the comparison so that the control signal controls the charge pump to stop supplying the charging current if the reference voltage is smaller than the load voltage. Accordingly, as long the load voltage has not decreased to the low limit voltage no current is supplied to the piezoelectric load. In the phase where the charging is stopped, one or more electronic components of the electronic circuit 100, e.g. the voltage measurement circuit 113, may be switched off in order to reduce electronic noise. This phase may also be referred to as the low noise phase or discharging phase.

Figure 2:
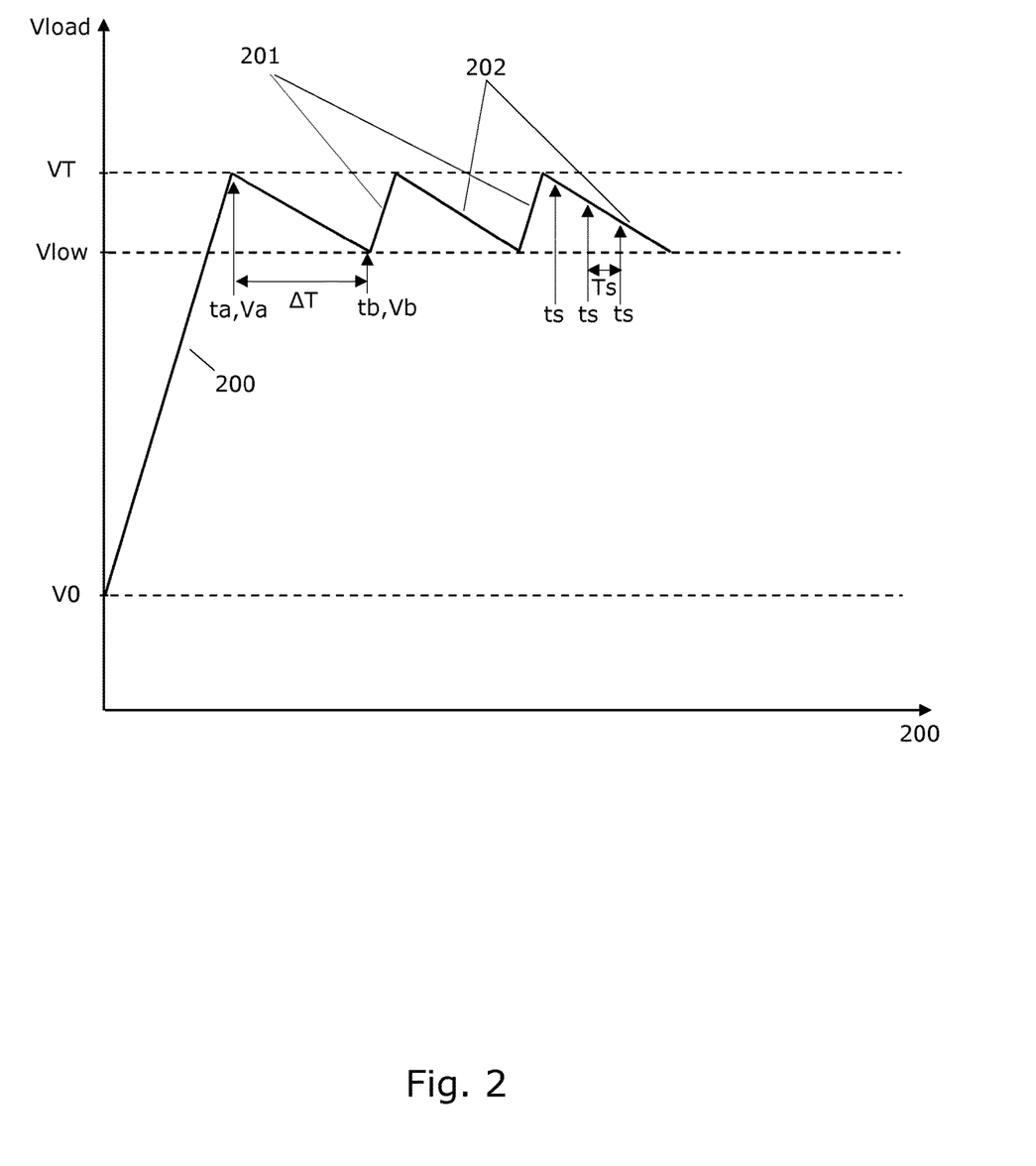
FIG. 2 illustrates changes in the load voltage during charging and discharging phases.

FIG. 2 illustrates the function of the electronic circuit 100 by showing changes in the load voltage Vload, during charging phase 200, refresh charging phases 201 and hold phases 202. The piezoelectric load 190 is initially charged from V0, e.g. zero volt, up to the target voltage VT. Accordingly, during the initial charging from V0 to VT, the adjustable reference voltage is set to VT. After the load voltage has reached the target voltage VT, the adjustable reference voltage is set to the low voltage limit Vlow and the charging of the load 190 is stopped, e.g. by switching the charge pump 111 off. As long as the load voltage, measured by the voltage measurement circuit 113, is greater than the Vlow, the discharging phase is maintained. When the load voltage reaches the low limit voltage Vlow, the adjustable reference voltage is set to the target voltage and a new refresh charging phase 201 is initiated. After the charging phase 200 or refresh charging phase 201 the circuit may enter the hold phase 202. During the hold phase the purpose may be to preserve the charge on the load 190. Therefore the switch 112 may be opened to isolate the load, and closed at intervals to measure the voltage on the load to determine if it is necessary to initiate a refresh charging phase 201. The length of the hold phase can be used to approximate the leakage current of the load when the duty cycle is low. The effective measurement current is calculated by summing the approximate leakage current of the switch 112 and the duty-cycle corrected current drawn by the measurement circuit 113. The duty cycle can be calculated as the time the switch 112 is closed for performing the voltage measurement as a percentage of the sample cycle time TS. The measurement time may be in the range from 100 ns to 10 us, whereas the sampling cycle time TS may be in the range from 0.1 ms to 10 ms during the hold time 202. The current drawn by the measurement circuit may be in the order 1 uA to 1 mAuA. By adjusting the measurement current and measurement duty cycle a very wide range of effective measurement current corrected for duty cycle may be achieved.

For example, when the load voltage reaches the target voltage, the output voltage 133 of the comparator 114 may change to a high level. This change is detected by the logic circuit 121 which causes a setting of the adjustable reference voltage 132 to the low limit voltage. When the load voltage has decreased to the low limit voltage, the output voltage 133 of the comparator 114 may change to a low level. This change is detected by the logic circuit 121 which causes a setting of the adjustable reference voltage 132 to the target voltage. At the same time the logic circuit 121 may generate a charge control signal 131 which causes the charge pump 111 to be switched on.

Accordingly, the electronic circuit, e.g. the control logic 121, may configured to set the adjustable reference voltage to the target voltage, after the load voltage has reached the low limit voltage and configured to set the adjustable reference voltage to the low limit voltage, after the load voltage has reached the target voltage.

The electronic circuit may be configured to perform the comparison of the adjustable reference voltage with the load voltage either continuously or at discrete points in time. For example, as illustrated in FIG. 2, the comparison may be performed at discrete time points ts. The discrete time points ts may be separated in time by a fixed period of time Ts or the separation may be non-constant, e.g. adjustable dependent on the charging, refresh charging and hold phases 200, 201, 202. The comparison at discrete points in time may also involve sampling the load voltage at the same or substantially the same discrete points in time within a hold phase. The sample rate may preferably be varied depending on an expectation of the current extracted from the load or supplied to the load.

By discrete time points is meant that the comparison and/sampling is performed at distinct, separate points in time. In other words the comparison is performed intermittently in time with a given measurement frequency. This measurement frequency can be set via the control interface 123.

With reference to FIG. 1, the comparison of the adjustable reference voltage with the load voltage at discrete points in time may be performed by controlling the switch 112 to connect the load 190 with the measurement circuit 113, optionally also with the charge pump 111 depending on the configuration of the electronic circuit 100, at intermittently in time. For example, at the time points ts, the switch 122 is controlled to establish a connection between the load 190 and the measurement circuit 113, optionally also with the charge pump 111. It is understood that the connection is maintained for a given period of time, e.g. a period in the range from a few nanoseconds to several microseconds, e.g. in the range from 100 ns to 10 μs, such as from 200 ns to 5 μs, or even from 400 ns to 2 μs, for each time point ts.

Accordingly, the electronic circuit may be configured to obtain the load voltage at discrete points in time, e.g. by activating the switch 112, in order to perform the comparison of the adjustable reference voltage with the load voltage at discrete points in time.

Alternatively, the load voltage may be measured continuously or with a given sampling rate and the and electronic circuit 100 may be configured so that the comparison of the adjustable reference voltage with the load voltage is performed at discrete points in time.

Since the piezoelectric load is discharged by a small amount of charge each time the switch 112 is closed, i.e. each time the load voltage is sampled and compared with the adjustable reference voltage 132, it may be desirable that the period of time where the switch 112 is closed or where the comparison is performed is as small as possible, at least during the discharging phases 202. Accordingly, the electronic circuit may comprise a switch 112 controllable to intermittently connect the load terminal of the piezoelectric load 190 with the voltage measurement circuit 112, e.g. with a given measurement frequency. The switch may be a mechanical or an electronic switch.

The electronic circuit 100 may be used in different piezoelectric actuator systems which in addition to the electronic circuit 100 also comprises the piezoelectric load 190 or other capacitive loads. Accordingly, the electronic circuit 100 may be seen as a circuit suitable for driving capacitive loads or actuators, where the capacitive loads may be used for various actuating purposes. The electronic circuit may even be used to drive multiple loads, e.g. by having one switch 112 connected to each load in turn.

Figure 3:
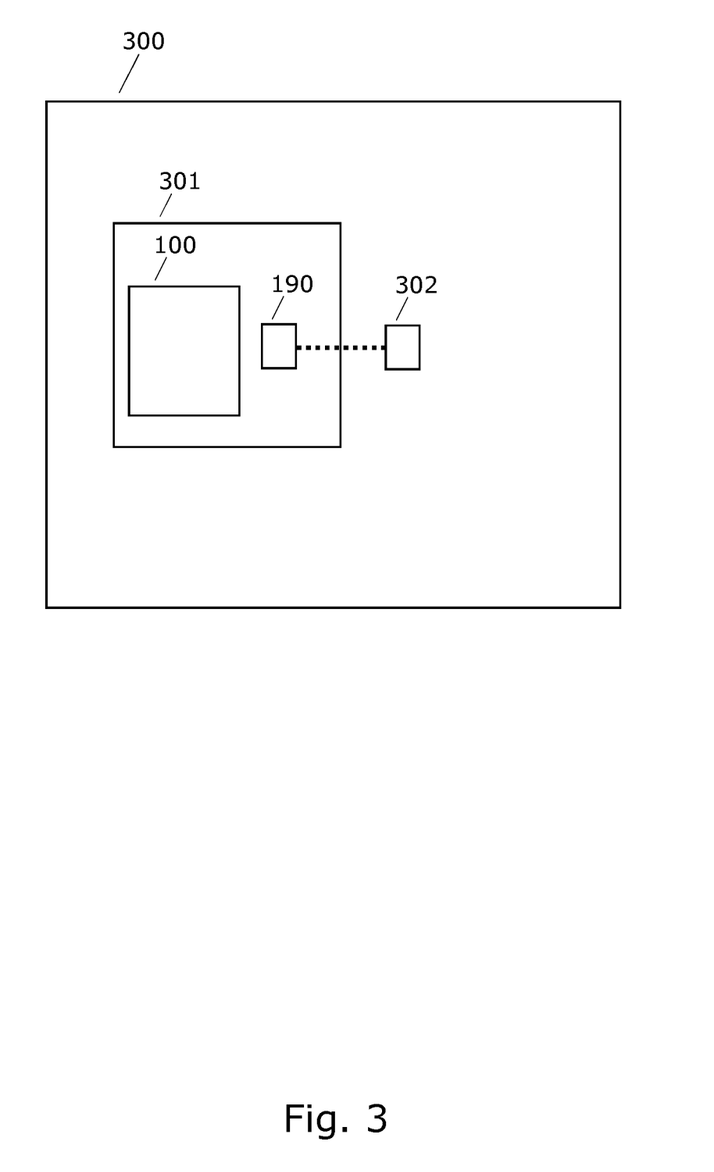
FIG. 3 illustrates a deformable lens unit.

The electronic circuit may be particularly useful in a piezoelectric actuator system used in a deformable lens unit 300 as illustrated in FIG. 3.

FIG. 3 illustrates a deformable lens unit 300 which includes:
- a piezoelectric actuator system 301 which includes the electronic circuit 100 and the piezoelectric load 190, and
- a deformable lens 302 arranged to be deformed by the piezo electric load 190, where the piezoelectric actuator system 301 is configured to deform the lens to achieve different optical powers.

The deformable lens unit 300 may be a micro unit which further comprises a CCD chip or similar digital image recording chip. The deformable lens 302 may be a polymer lens or a glass lens which is connected (illustrated with the dotted line) with the piezoelectric load 190 so that when the charging of the piezolelectric load 190 is changed the lens is deformed to achieve different optical powers. An example of a deformable lens actuated by piezoelectric elements is provided in WO2008100154.

FIG. 1 illustrates that the electronic circuit 100 may comprise a timer or a counter circuit 122. As illustrated in FIG. 2, the counter 122 is configured to determine a charging or discharging time $\Delta T$ between a first point in time to when the load voltage has a first voltage Va and a second point in time tb when the load voltage has a second voltage Vb. The counting frequency of the timer may be set to match the maximum bandwidth of the comparator circuit so that events are captured with maximum practical time resolution. A typical counting frequency c could be in the range 100 KHz to 10 MHz, such as in the range from 300 KHz to 3 MHz, depending, e.g., on the capacitance of the load.

For example, the logic circuit 121 may be configured to start the timer when the comparator output 133 provides a change indicating that the load voltage corresponds to the first voltage Va and to stop the timer when the comparator output 133 provides another change indicating the load voltage corresponds to the second voltage Vb. The first and second voltages Va, Vb may be set as adjustable reference voltages so that the comparator 114 generates a change in the output 133 when the load voltage equals the adjustable reference voltage. The difference $\Delta T$ between the first and second points in time may be used for determining a capacitance of the piezoelectric load 190 during charging and discharging phases 201, 202.

In general the capacitance may be determined by the formula:

$$C(v)=(I*\Delta T)/(Vb \times Va)$$

where C(v) is the average capacitance of the piezo element between the voltages Va and Vb. I is a known or estimated charging or discharging current.

Figure 4:
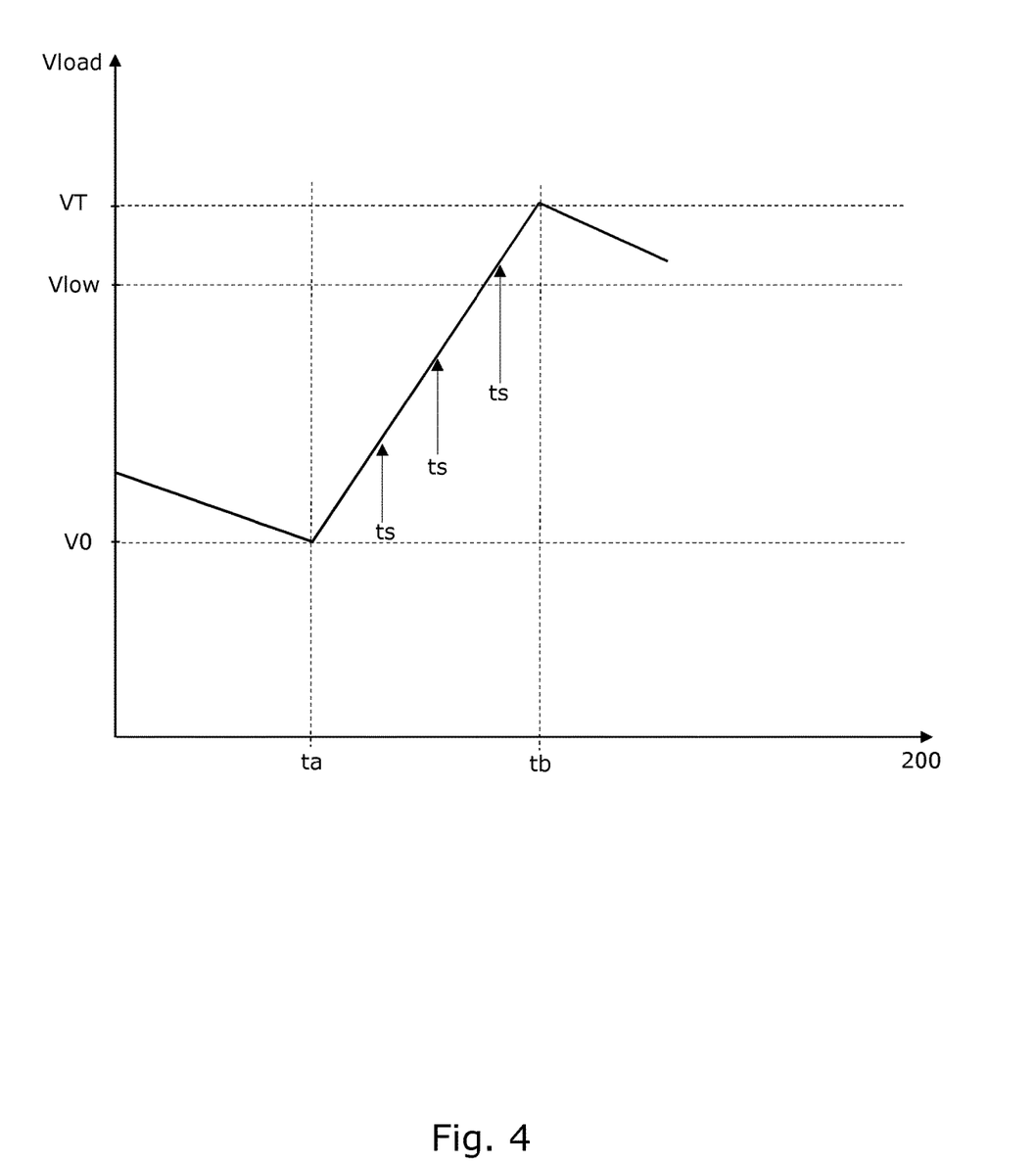
FIG. 4 illustrates an example for determining the capacitance during charging phases.

FIG. 4 illustrates an example for determining the capacitance during charging phases. Here the first point in time ta is a point in time where the charge pump initiates charging with a charging current Ip and where the first voltage Va is an initial load voltage V0. Here the initial voltage V0 could be a zero voltage corresponding to a completely discharged piezoelectric element.

The first point in time ta could also be a point in time where the charge pump initiates charging with a charging current Ip from the low limit voltage Vlow, i.e. where Vlow represents the first voltage Va.

The first point in time ta could also be a point in time where the charge pump initiates or continues charging with a charging current Ip from intermediate voltages.

The second point in time tb could be a point in time where the charge pump stops or continues charging with a charging current Ip and where the second voltage Vb is a final load voltage, e.g. the target voltage VT, or other intermediate voltages.

FIG. 4 illustrates the discrete measurement times ts during the charging phase.

The capacitance during charging phases can be determined using:

$$C(v)=(Ip*\Delta T)/(Vb-Va).$$

Analogously, the capacitance C(v) could be determined during discharging phases wherein the first point in time ta is a point in time where the piezoelectric load 190 is discharged with a predetermined sink current Is and where the first voltage Va is an initial load voltage, e.g. VT or other intermediate voltages. The sink current may be provided by a current sink, e.g. by discharging the load 190 though the measurement circuit 113 by keeping the switch 112 closed during the discharging. The sink current could also be provided by other circuits, e.g. a dedicated discharging resistor.

Accordingly, the electronic circuit 100 may further comprise a current sink for discharging the piezoelectric load with a sink current Is. For example, the current sink may in one embodiment be a resistive circuit or a voltage reduction circuit comprised by the voltage measurement circuit 113, or constituting the voltage measurement circuit 113, where the voltage reduction circuit or resistive circuit is connected to the load 190 for reducing the terminal voltage to the load voltage.

The capacitance during discharging phases 202 can be determined using:

$$C(v)=(Is*\Delta T)/(Vb-Va).$$

The capacitance could be measured at periodically, e.g. after a predetermined number of uses or expansion cycles of the piezoelectric 190, during an initial charging of the piezoelectric load 190.

In the example, where the sink current is provided by discharging the load 190 though the measurement circuit 113 by keeping the switch 112 closed during the discharging, the output resistance of the charge pump 111 is high. In practice, the discharging current through the measurement circuit 113 is much higher than the load leakage current, i.e. the discharging current through the piezoelectric load 190.

Figure 5:
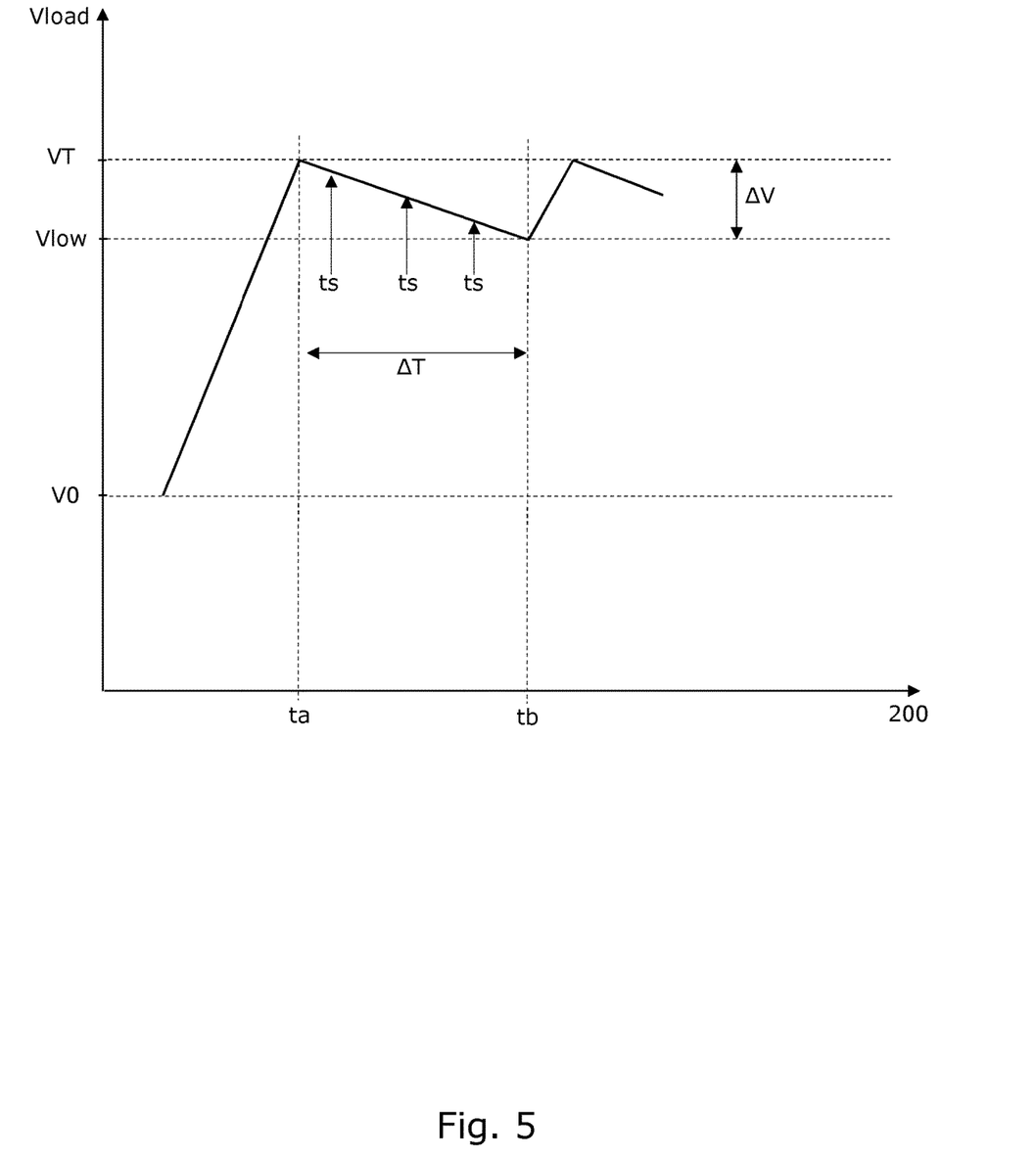
FIG. 5 illustrates an example for determining the leakage current of the piezoelectric load.

Therefore, when the switch 112 is closed, the current Iload flowing from the load 190 is Iload=Ilkg+VR/R, where Ilkg is the load leakage current and VR is the voltage across the resistive measurement circuit 113. Here it is assumed that the resistance of the measurement circuit is R, i.e. the total resistance through which the load 190 is discharged. Since the load leakage resistance is much higher than the resistance R of the measurement circuit, we have the approximation Iload=VR/R. Since the attenuator resistance R is known, the selected drop voltage $\Delta V$ (see FIG. 5), and the discharging time $\Delta T$ can be used to approximate the load capacitance C(v) by the formula:

$$C(v)=\Delta T*((VT-\Delta V/2)/R)/\Delta V$$

where C(v) is the average load capacitance between the voltages Va and Vb, e.g. between VT and Vlow, and $\Delta V=Va-Vb$.

The control logic 121 may be configured to determine the capacitance C(v), during charging or discharging phases, at different voltages in order to determine a Capacitance versus Voltage curve (CV-curve). The voltage for a given capacitance measurement may be given as the average (Vb-Va)/2 of the first and second voltages and the counter 122 is used to determine the period $\Delta T$ between the first and second voltages Va and Vb.

The capacitance as a function of voltage of a piezoelectric load may change over time. Similarly, other performance-related characteristics of the piezoelectric load may change over time. Accordingly, changes in the CV curve may indicate changes of such other performance-related characteristics.

FIG. 5 illustrates an example where the first point in time ta is the time when the load voltage has reached the target voltage VT (the first voltage) and the second point in time tb is the time when the load voltage has reached the low limit voltage Vlow (the second voltage). Here the piezoelectric load has been discharged substantially by a leakage current Ilkg comprising a leakage current of the piezoelectric load 190 Itrue and a measurement current Im drawn at least by the measurement circuit 113, i.e. Ilkg=Itrue+Im.

The leakage current Ilkg is given by $$Ilkg=(C(v) \times \Delta V)/\Delta T$$

where C(v) is the average capacitance of the load 190 between the voltages VT and Vlow, e.g. determined by $C(v)=(Is*\Delta T)/(Vb-Va)$, and $\Delta V$ is the allowable droop voltage given by $\Delta V=VT-Vlow$. If the current Im drawn by the measurement circuit is known, then the true leakage current can be determined as $$Itrue=Ilkg-Im.$$

The current Im, or average current Im, drawn by be measurement circuit 113 during a discharging period 202, can be determined since the load voltages at the measurements points ts are known and since the duration ts of each measurement ts is known.

In order to minimise the measurement current Im, the load voltages may be obtained intermittently at discrete points in time ts, e.g. by activating the switch 112 for short times at the time points ts, so that only a small current is drained from the load 190 through the measurement circuit 113.

The determination of the leakage current Itrue of the piezoelectric load 190 may be used for performing a test of piezoelectric load 190. E.g. if Itrue is high, e.g. greater than an average value of historic values of Itrue, this may indicate a problem with the piezoelectric load.

The electronic circuit 100, e.g. the control logic 121, may be configured to set the target voltage (VT), the low limit voltage (Vlow) or both dependent on a received control parameter. Furthermore, the electronic circuit 100 may be configured to set the sampling period Ts and the sampling duration ts dependent on a received control parameter. For example, the control parameter may be received via the control interface 123.

The control logic 121 may also be configured to send determined measurements of the charging or discharging time ΔT, the leakage current (Ilkg or Itrue) via the control interface 123, e.g. for further processing by an external processing unit.

In relation to a specific use of the electronic circuit 100 in a deformable lens unit 300, the discharging phase 202, i.e. the low noise phase, may be used using during imaging using an image chip. Accordingly, the discharging time ΔT or part of the discharging time ΔT may be used as the exposure time of an image chip, i.e. the exposure time where the pixels of the chip accumulates charges generated by incoming photons. Since the charge pump 112 is deactivated (turned off or in a sleeping mode) the noise sensitive image sensor is not affected by electronic noise from the image sensor. It is noted that the sampling period Ts may be increased during the discharging period in order to further reduce noise or to reduce the leakage current through the measurement circuit 113.

In general an exposure time may be substantially equal to the discharging period ΔT, the exposure time may constitute a fraction of the discharging period ΔT, or the exposure time may be constituted by a plurality of discharging periods ΔT and/or fractions of discharging periods T.

Since the optical power, i.e. focal length, of the lens changes dependent on the decreasing load voltage Vload during the low noise period, the image of the image on the image sensor changes, e.g. image sharpness may decrease during the exposure time. Ideally the optical power should be constant during the exposure period. On the other hand, some variation of the optical power may be acceptable if the variation does not reduce image quality significantly. The acceptable variation of the optical power during an exposure period may depend on the desired focal distance (set by target voltage VT), lighting conditions and e.g. user preferences. By setting the low limit voltage Vlow to a suitable level, e.g. via an input from the control interface 123, the piezoelectric load 190, i.e. the lens actuator, can be controlled so that it is ensured that the optical power does not decrease below an acceptable value of the optical power.

Figure 6:
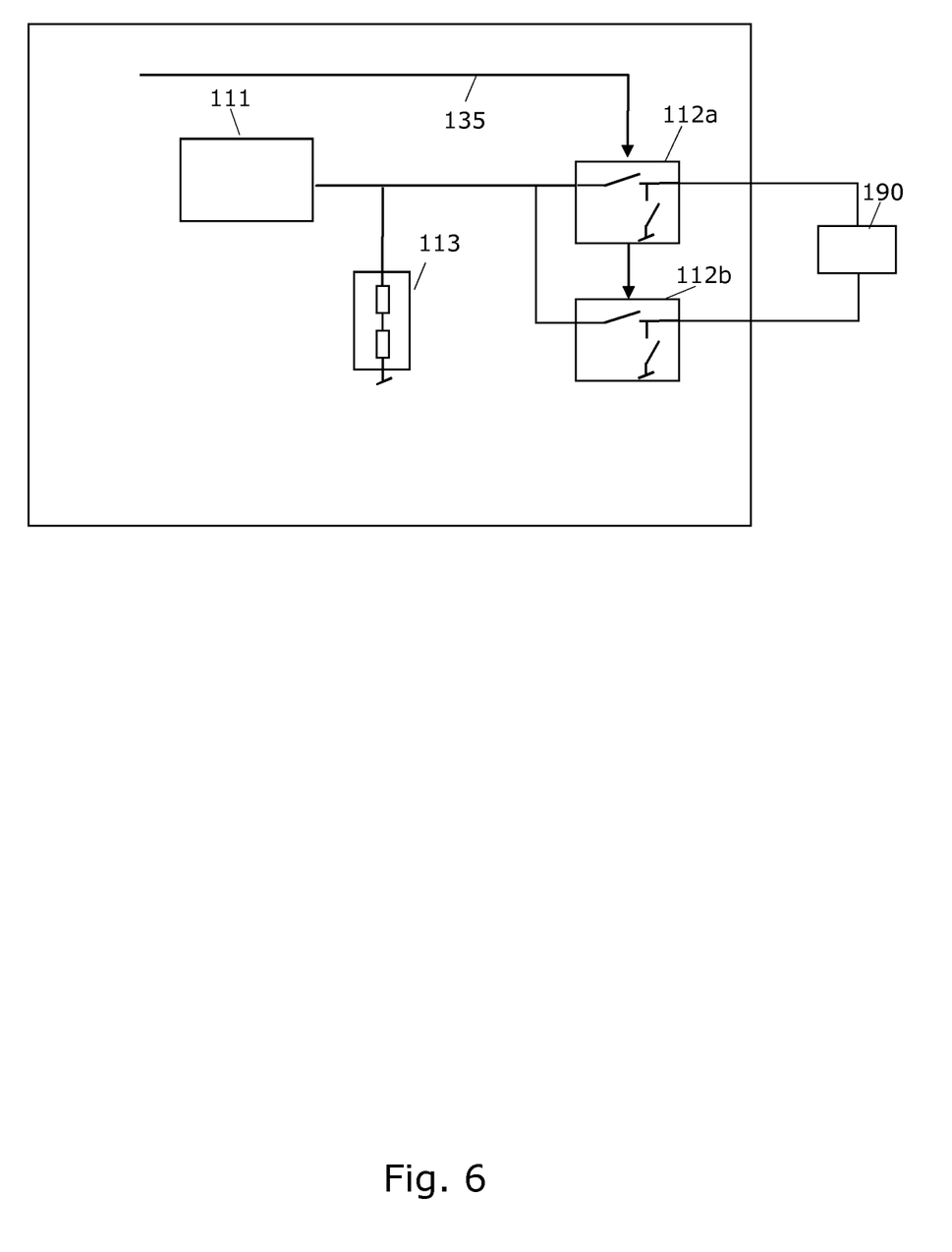
FIG. 6 illustrates a second embodiment of an electronic circuit for controlling charging of a piezoelectric load.

FIG. 6 illustrates an embodiment using a differential drive option of the load. This embodiment relates to the embodiment shown in FIG. 1, and like reference numerals refer to identical or similar parts or components. Thus the relevant parts of FIG. 1 are repeated. The output switch 112 is replaced by the differential drive output switches 112a and 112b. These switches connect the load terminals either to GND or to the charge pump output. This way it is possible to reverse the polarity of the load 190 without generating a negative voltage referred to GND. When one polarity is selected, the "negative" load terminal is connected to GND, and the other "positive" terminal is either high impedance or connected to charge pump output 111 or measurement/voltage reduction circuit 113 as described above. By reversing the roles of the switches 112a and 112b the polarity is reversed.

Figure 7:
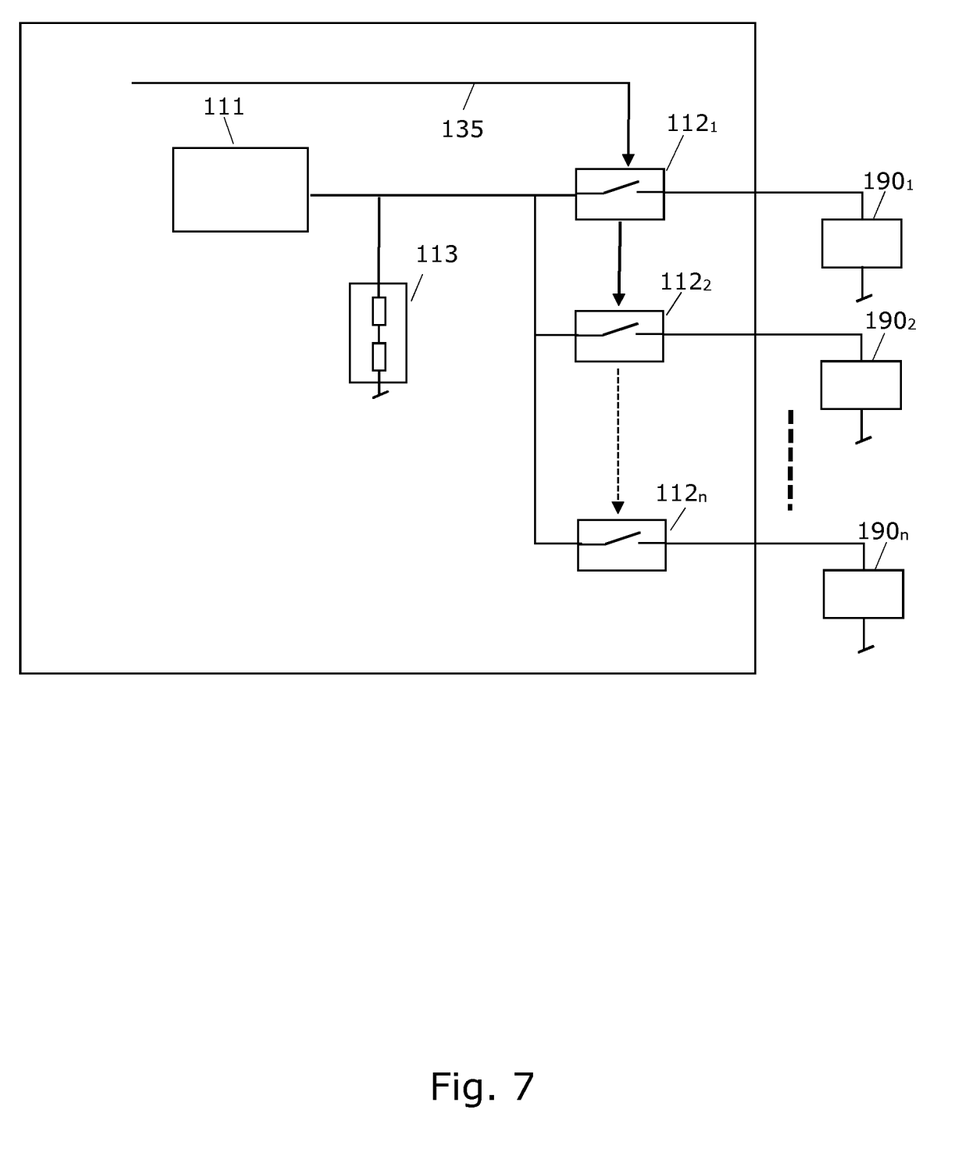
FIG. 7 illustrates a third electronic circuit for controlling charging of multiple piezoelectric loads.

FIG. 7 illustrates an embodiment wherein one driver is used to control multiple loads. The charge pump 111 and voltage monitor/reduction circuit 113 is connected to a set of loads $190_1$ $190_2$ ... $190_n$ via the switches $112_1$ $112_2$ ... $112_n$. At any time, one or several loads with the same target voltage is connected to the charge pump 111 and voltage monitor/reduction circuit 113. The other loads are put in high impedance, thus preserving the charge on each load. The controller will connect each load/set of loads in any order depending on the allowable voltage variation permitted at each load.

In one embodiment, one or more of the loads may be differential as illustrated in FIG. 6.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An electronic circuit for controlling charging of a piezoelectric load, the electronic circuit comprising:
    a charge pump configured to supply a charging current to the piezoelectric load dependent on a charge control signal,
    a measurement circuit configured to obtain a load voltage corresponding to a terminal voltage at a load terminal of the piezoelectric load,
    a comparator circuit configured to compare an adjustable reference voltage with the load voltage, wherein
    the electronic circuit is configured to determine the charge control signal dependent on the comparison so that the charge control signal controls delivery of the charging current dependent on the comparison, and wherein
    the electronic circuit is configured to set the adjustable reference voltage to a target voltage and to set the adjustable reference voltage to a low limit voltage, being lower than the target voltage, when the load voltage reaches the target voltage.

2. The electronic circuit according to claim 1, wherein the electronic circuit is configured to generate the charge control signal dependent on the comparison so that control signal controls the charge pump to supply the charging current if the reference voltage is larger than the load voltage.

3. The electronic circuit according to claim 1, wherein the electronic circuit is further configured to generate the charge control signal dependent on the comparison so that the control signal controls the charge pump to stop supplying the charging current if the reference voltage is smaller than the load voltage.

4. The electronic circuit according to claim 1, wherein the electronic circuit is configured to set the adjustable reference voltage to the target voltage, when the load voltage reaches the low limit voltage.

5. The electronic circuit according to claim 1, wherein the electronic circuit is configured obtain the load voltage at discrete points in time.

6. The electronic circuit according to claim 1, further comprising
a counter circuit configured to determine a charging or discharging time between a first point in time when the load voltage has a first voltage and a second point in time when the load voltage has a second voltage.

7. The electronic circuit according to claim 6, wherein the first point in time is a point in time, wherein the charge pump initiates charging and, wherein the first voltage is an initial load voltage.

8. The electronic circuit according to claim 6, further comprising a current sink for discharging the piezoelectric load with a sink current.

9. The electronic circuit according to claim 1, being configured for isolating the measurement circuit from the load in between sampling instants.

10. The electronic circuit according to claim 6, wherein the first point in time is the time when load voltage has reached the target voltage, and the second point in time is the time when the load voltage has reached the low limit voltage, and wherein the piezoelectric load has been discharged substantially by a leakage current comprising a leakage current of the piezoelectric load and a measurement current drawn at least by the measurement circuit.

11. The electronic circuit according to claim 1, wherein the charging current is an adjustable charging current, depending on the charge control signal from the electronic circuit.

12. A piezoelectric actuator system comprising,
an electronic circuit according to claim 1 and
the piezoelectric load.

13. A deformable lens unit comprising,
the piezoelectric actuator system according to claim 12, and
a deformable lens configured to be deformed by the piezoelectric load, wherein the piezoelectric actuator system is configured to deform the lens to achieve different optical powers.

14. The deformable lens unit according to claim 13, wherein the electronic circuit is configured to set the target voltage or low limit voltage dependent on a control parameter.

15. A method for controlling charging of a piezoelectric load, the method comprising:
supplying a charging current to the piezoelectric load dependent on a charge control signal,
obtaining a load voltage corresponding to a terminal voltage at a load terminal of the piezoelectric load,
comparing an adjustable reference voltage with the load voltage,
determining the charge control signal dependent on the comparison so that the control signal controls delivery of the charging current dependent on the comparison, and
setting the adjustable reference voltage to a target voltage and setting the adjustable reference voltage to a low limit voltage being lower than the target voltage, when the load voltage reaches the target voltage.

16. The method according to claim 15, wherein the method further comprises:
supplying a second charging current to a second piezoelectric load dependent on a second charge control signal,
obtaining a second load voltage corresponding to a terminal voltage at a second load terminal of the second piezoelectric load,
comparing a second adjustable reference voltage with the second load voltage,
determining the second charge control signal dependent on the comparison so that the second control signal controls delivery of the second charging current dependent on the comparison, and
setting the second adjustable reference voltage to a second target voltage and setting the second adjustable reference voltage to a second low limit voltage being lower than the second target voltage, when the second load voltage reaches the second target voltage.

* * * * *